United States Patent
Koike et al.

(10) Patent No.: US 11,701,885 B2
(45) Date of Patent: Jul. 18, 2023

(54) LIQUID EJECTING HEAD, LIQUID EJECTING APPARATUS, AND ACTUATOR

(71) Applicant: Seiko Epson Corporation, Tokyo (JP)

(72) Inventors: Harunobu Koike, Matsumoto (JP); Masao Nakayama, Shiojiri (JP); Toshihiro Shimizu, Fujimi-machi (JP); Yasushi Yamazaki, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 17/486,345

(22) Filed: Sep. 27, 2021

(65) Prior Publication Data

US 2022/0097374 A1    Mar. 31, 2022

(30) Foreign Application Priority Data

Sep. 29, 2020   (JP) ................................. 2020-163350

(51) Int. Cl.
*B41J 2/14* (2006.01)

(52) U.S. Cl.
CPC ................................ *B41J 2/14233* (2013.01)

(58) Field of Classification Search
None
See application file for complete search history.

(56) References Cited

U.S. PATENT DOCUMENTS

| 2008/0088207 A1* | 4/2008 | Li | H01L 41/318 310/358 |
| 2014/0111582 A1* | 4/2014 | Ohashi | B41J 2/161 347/70 |
| 2017/0212278 A1* | 7/2017 | Abe | G02B 1/115 |

FOREIGN PATENT DOCUMENTS

JP    2008-078407    4/2008

\* cited by examiner

*Primary Examiner* — Erica S Lin
(74) *Attorney, Agent, or Firm* — Workman Nydegger

(57) ABSTRACT

The interface region may include a region in which first intensity is higher than second intensity and in which the first intensity is higher than third intensity, where a degree of orientation of the (−211) crystal face of the second layer is denoted as the first intensity, the degree of orientation of the (−111) crystal face of the second layer is denoted as the second intensity, and the degree of orientation of the (002) crystal face of the second layer is denoted as the third intensity. The surface-layer region may include a region in which the first intensity is higher than the third intensity and in which the second intensity is higher than the third intensity.

13 Claims, 11 Drawing Sheets

LIQUID EJECTING HEAD, LIQUID EJECTING APPARATUS, AND ACTUATOR

The present application is based on, and claims priority from JP Application Serial Number 2020-163350, filed Sep. 29, 2020, the disclosure of which is hereby incorporated by reference herein in its entirety.

BACKGROUND

1. Technical Field

The present disclosure relates to a liquid ejecting head, a liquid ejecting apparatus, and an actuator.

2. Related Art

A liquid ejecting head provided with a vibrating plate including an insulating film composed of $ZrO_2$ and an elastic film composed of $SiO_2$ and provided with a piezoelectric element that displaces the vibrating plate is known (for example, JP-A-2008-78407).

The insulating film may have residual stress such as tensile stress. Consequently, when an external force is applied to the vibrating plate in response to actuation of the piezoelectric element, the vibrating plate may crack.

SUMMARY

According to a first aspect of the present disclosure, a liquid ejecting head is provided. The liquid ejecting head includes a piezoelectric element and a vibrating plate configured to vibrate in response to actuation of the piezoelectric element, the vibrating plate including a first layer that contains $SiO_2$ and a second layer that contains $ZrO_2$ and that is stacked on the first layer. The second layer includes an interface region in contact with the first layer and a surface-layer region opposite to the first layer with the interface region interposed therebetween, and the interface region may include a region in which a first intensity is higher than a second intensity and in which the first intensity is higher than a third intensity, where a degree of orientation of the (−211) crystal face of the second layer, measured by using an X-ray diffraction method, is denoted as the first intensity, the degree of orientation of the (−111) crystal face of the second layer, measured by using the X-ray diffraction method, is denoted as the second intensity, and the degree of orientation of the (002) crystal face of the second layer, measured by using the X-ray diffraction method, is denoted as the third intensity. The surface-layer region may include a region in which the first intensity is higher than the third intensity and in which the second intensity is higher than the third intensity.

According to a second aspect of the present disclosure, a liquid ejecting apparatus is provided. The liquid ejecting apparatus includes the liquid ejecting head according to the first aspect and a control portion that controls an ejection operation of the liquid ejecting head.

According to a third aspect of the present disclosure, an actuator is provided. The actuator includes a piezoelectric element and a vibrating plate configured to vibrate in response to actuation of the piezoelectric element, the vibrating plate including a first layer that contains $SiO_2$ and a second layer that contains $ZrO_2$ and that is stacked on the first layer. The second layer includes an interface region in contact with the first layer and a surface-layer region opposite to the first layer with the interface region interposed therebetween, and the interface region may include a region in which first intensity is higher than second intensity and in which the first intensity is higher than third intensity, where a degree of orientation of the (−211) crystal face of the second layer, measured by using an X-ray diffraction method, is denoted as the first intensity, the degree of orientation of the (−111) crystal face of the second layer, measured by using the X-ray diffraction method, is denoted as the second intensity, and the degree of orientation of the (002) crystal face of the second layer, measured by using the X-ray diffraction method, is denoted as the third intensity. The surface-layer region may include a region in which the first intensity is higher than the third intensity and in which the second intensity is higher than the third intensity.

DESCRIPTION OF EXEMPLARY EMBODIMENTS

A. First Embodiment

Figure 1:
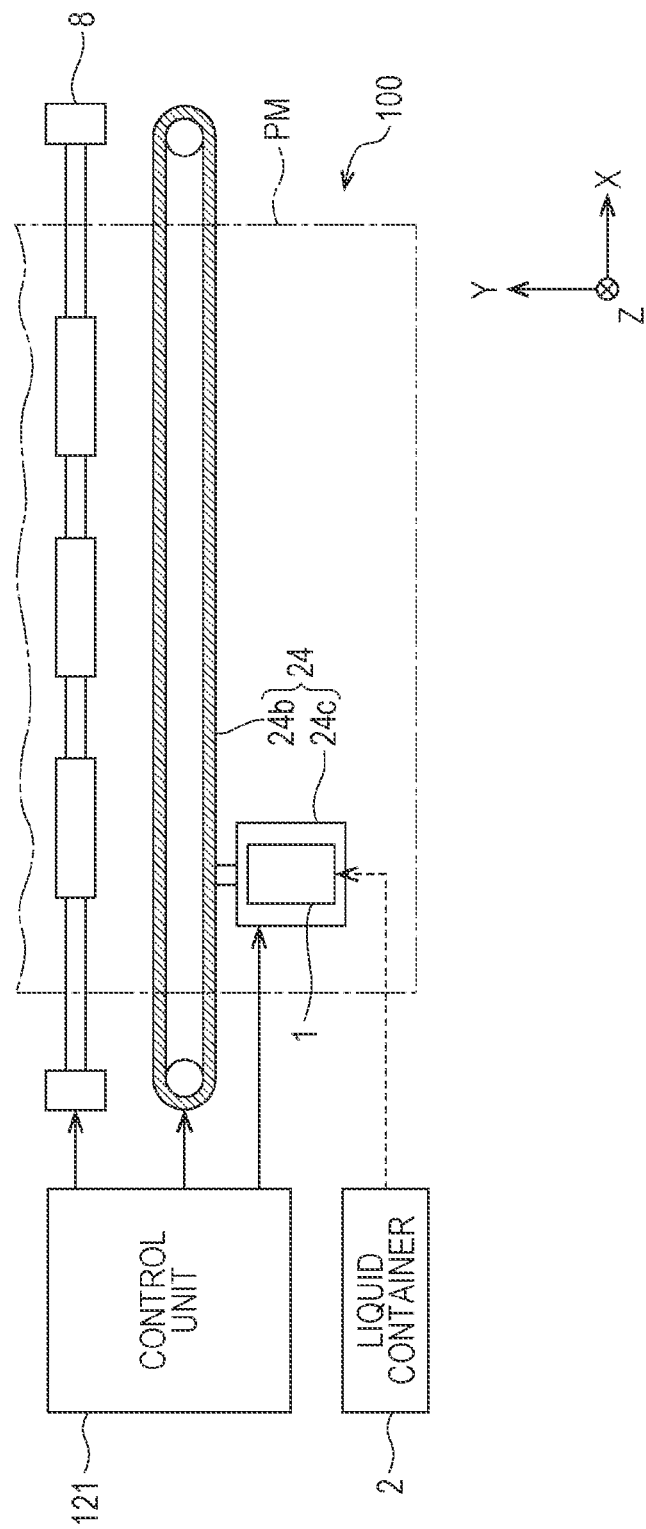
FIG. 1 is an explanatory diagram illustrating a liquid ejecting apparatus equipped with a liquid ejecting head.

FIG. 1 is an explanatory diagram illustrating a liquid ejecting apparatus 100 equipped with a liquid ejecting head 1 according to the present embodiment. The liquid ejecting apparatus 100 is a printing apparatus of an ink jet system that ejects a liquid ink. The liquid ejecting apparatus 100 includes a liquid container 2 configured to store the ink, and an image is formed on a medium PM by using the ink in the liquid container 2. FIG. 1 schematically illustrates the X-direction, the Y-direction, and the Z-direction orthogonal to each other. Each direction illustrated in FIG. 1 is common to FIG. 1 and subsequent drawings.

The liquid ejecting apparatus 100 includes the liquid ejecting head 1, a movement mechanism 24, a transport mechanism 8, and a control unit 121. The liquid ejecting head 1 is an ink jet-type recoding head configured to eject an ink supplied from the liquid container 2. The movement mechanism 24 includes a ring-like belt 24b and a carriage 24c configured to hold the liquid ejecting head 1. The carriage 24c is fixed to the belt 24b. The movement mechanism 24 reciprocates the liquid ejecting head 1 together with the carriage 24c in a movement direction by rotating the belt 24b in both forward and reverse directions. The transport mechanism 8 transports the medium PM in a direction intersecting the movement direction of the liquid ejecting head 1.

The control unit 121 functions as a control portion that forms an image on the medium PM by operating the transport mechanism 8, the movement mechanism 24, and the liquid ejecting head 1 in accordance with each other. More specifically, the control unit 121 forms an image on the medium PM by repeatedly controlling ink ejection from the liquid ejecting head 1 and reciprocating the liquid ejecting head 1 based on control of the operation of the movement mechanism 24, while the medium PM is transported by controlling the operation of the transport mechanism 8.

Figure 2:
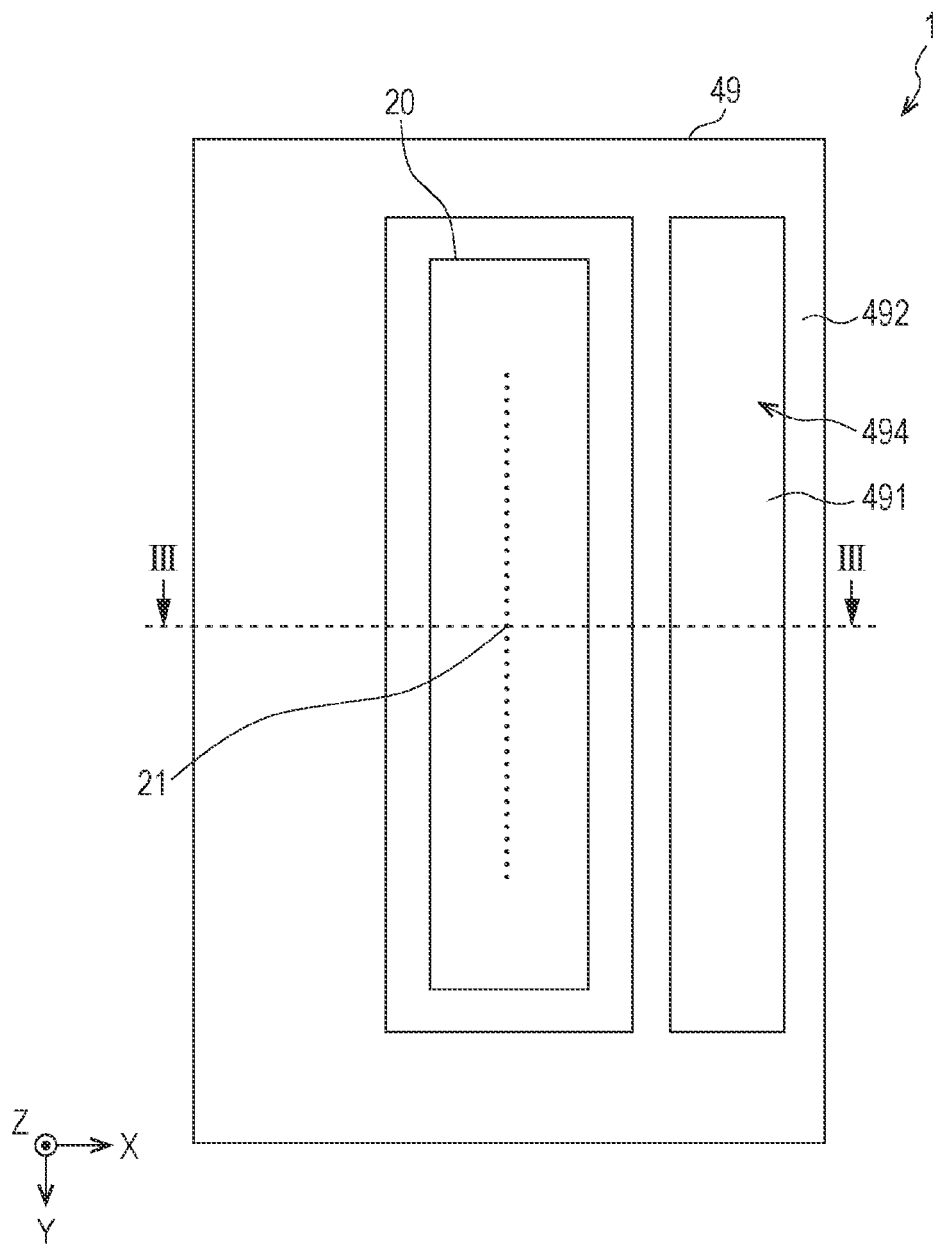
FIG. 2 is a plan view of a liquid ejecting head.

FIG. 2 is a plan view of the liquid ejecting head 1. Regarding the liquid ejecting head 1 in FIG. 2, the surface facing the medium PM is provided with a nozzle plate 20. A plurality of nozzles 21 are arranged in one direction in the nozzle plate 20.

Figure 3:
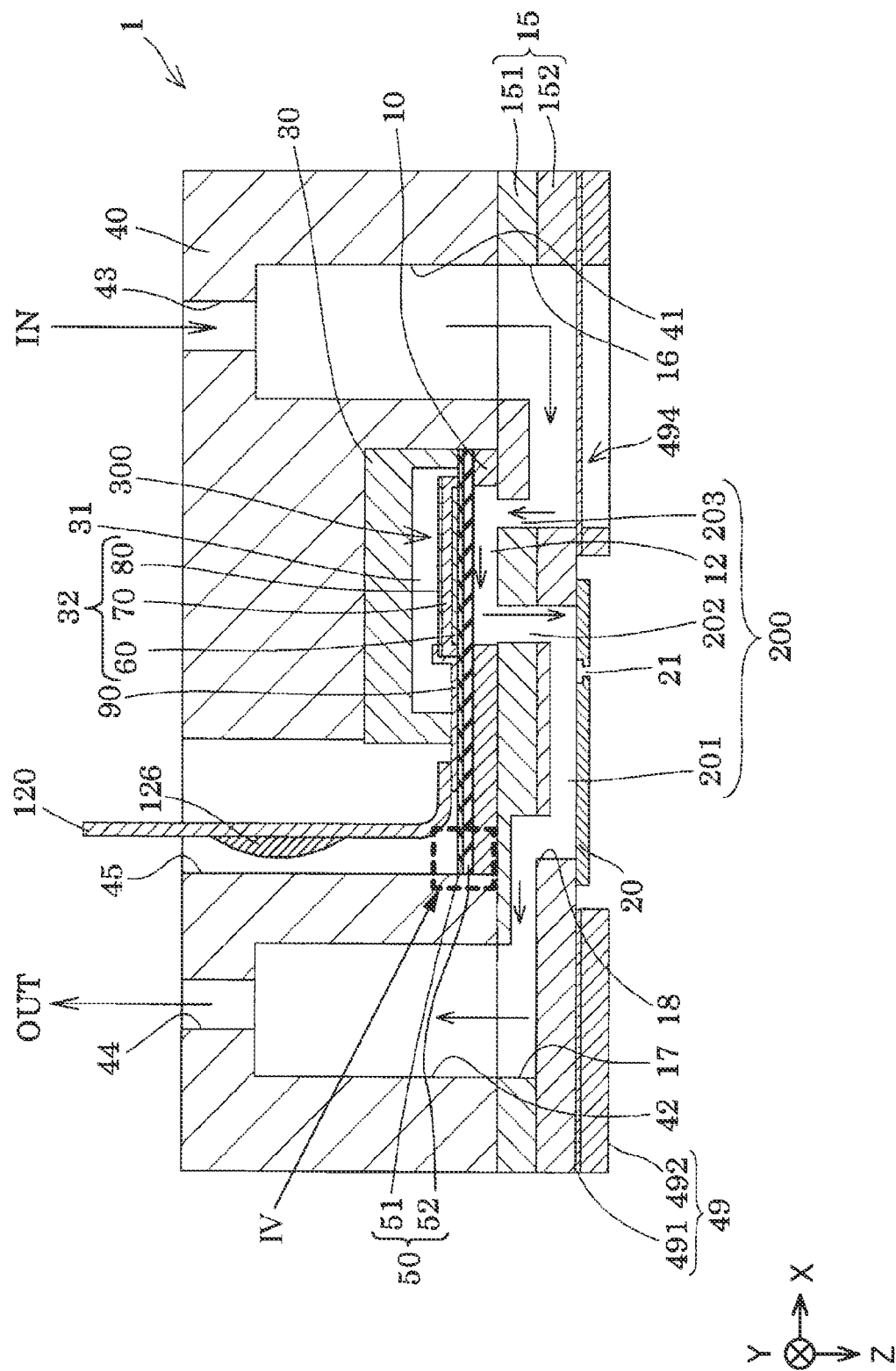
FIG. 3 is a sectional view cut along line III-III in FIG. 2.

FIG. 3 is a sectional view cut along line III-III in FIG. 2. The liquid ejecting head 1 includes a flow-passage-forming substrate 10, a communication plate 15, the nozzle plate 20, a compliance substrate 49, a vibrating plate 50, an actuator 300, a protective substrate 30, and a case member 40. Regarding the example in FIG. 3, the ink ejection direction of the nozzle 21 is in accord with the Z-direction. For the sake of facilitating understanding of the technology, in the following explanations, the ink ejection direction with respect to a reference position is also referred to as "down", and the direction opposite to the ink ejection direction is also referred to as "up".

The flow-passage-forming substrate 10 is a flat-plate-like member. The flow-passage-forming substrate 10 includes a pressure chamber 12. The communication plate 15 is arranged on the lower-surface side of the flow-passage-forming substrate 10. The communication plate 15 is formed by stacking a first communication plate 151 having ink flow passages and a second communication plate 152. The ink flow passages of the communication plate 15 include a first communication portion 16, a second communication portion 17, a third communication portion 18, a first flow passage 201, a second flow passage 202, and a supply passage 203. The first flow passage 201, the second flow passage 202, the supply passage 203, and the pressure chamber 12 are in communication with each other and constitute the ink flow passages. The number of the first flow passages 201, the second flow passages 202, the supply passages 203, and the pressure chambers 12 formed and arranged in the arrangement direction of the nozzles 21 corresponds to the number of the nozzles 21. The first flow passage 201, the second flow passage 202, the supply passage 203, and the pressure chamber 12 collectively constitute an individual flow passage 200. One each of the first communication portion 16, the second communication portion 17, and the third communication portion 18 is formed and functions as an ink flow passage common to a plurality of individual flow passages 200.

The nozzle plate 20 is arranged on the lower-surface side of the communication plate 15. The nozzle plate 20 blocks part of the opening on the lower-surface side of the communication plate 15 and functions as the inner wall of the first flow passage 201, the second flow passage 202, and the third communication portion 18, which serve as the ink flow passages. The nozzle 21 is formed at the position that blocks the first flow passage 201 of the nozzle plate 20.

The compliance substrate 49 is arranged on the lower-surface side of the communication plate 15 so as to surround the nozzle plate 20. The compliance substrate 49 blocks part of the opening on the lower-surface side of the communication plate 15 and functions as part of the inner wall of the first communication portion 16 serving as the ink flow passage. The compliance substrate 49 includes a sealing film 491 and a fixed substrate 492. The fixed substrate 492 is arranged on the lower-surface side of the sealing film 491. The fixed substrate 492 includes a compliance portion 494 in a region sealing the first communication portion 16. The compliance portion 494 is an opening which is formed in the fixed substrate 492 and at which the sealing film 491 is exposed. The compliance portion 494 is arranged in a region sealing the first communication portion 16 of the communication plate 15. Consequently, the sealing film 491 can be elastically deformed inward of the opening of the fixed substrate 492 so as to smooth fluctuations of the pressure in the first communication portion 16.

The protective substrate 30 is a substrate for housing the actuator 300. A recessed actuator-holding portion 31 is included in the protective substrate 30. A space for housing a plurality of deformable actuators 300 is delimited by the actuator-holding portion 31.

The case member 40 is a member for covering the upper surfaces of the flow-passage-forming substrate 10, the communication plate 15, and the protective substrate 30. The case member 40 has a coupling hole 45 and ink flow passages. The coupling hole 45 is a through hole that vertically passes through the case member 40. A flexible cable 120 provided with a driving circuit 126 is arranged in the coupling hole 45. The driving circuit 126 is a semiconductor element for supplying a driving signal for actuating a piezoelectric element 32. The flexible cable 120 is electrically coupled to a lead electrode 90 in the coupling hole 45.

The ink flow passages of the case member 40 include a first liquid chamber portion 41, a second liquid chamber portion 42, an inlet 43, an outlet 44. The inlet 43 and the outlet 44 are coupled to an ink storage chamber (not illustrated in the drawing). The first liquid chamber portion 41 is in communication with the first communication portion 16 of the communication plate 15, and the second liquid chamber portion 42 is in communication with the second communication portion 17 of the communication plate 15.

In FIG. 3, the flow direction of the ink is schematically illustrated by using arrows. The ink supplied from an ink storage portion is introduced into the first liquid chamber portion 41 in the case member 40 through the inlet 43. The flow of the ink supplied to the first liquid chamber portion 41 that flows to the first communication portion 16 of the communication plate 15 branches into each of the plurality of individual flow passages 200. Each of the branched ink flows flows through the supply passage 203, the pressure chamber 12, the second flow passage 202, and the first flow passage 201 in this order and merges when reaching the third communication portion 18. The ink supplied to the third communication portion 18 flows through the second communication portion 17 to the second liquid chamber portion 42 and is discharged through the outlet 44 to the ink storage portion. The ink discharged to the ink storage portion is circulated and reintroduced through the inlet 43.

The actuator 300 is arranged at the upper surface of the flow-passage-forming substrate 10. The actuator 300 converts an input electrical signal to physical movement and transfers this movement to the ink in the pressure chamber 12. The actuator 300 includes the piezoelectric element 32 and the vibrating plate 50. The piezoelectric element 32 includes a first electrode 60, a piezoelectric layer 70, and a second electrode 80.

The piezoelectric layer 70 is arranged between the first electrode 60 and the second electrode 80. The piezoelectric layer 70 is a layer composed of, for example, lead zirconate titanate (PZT) and deforms in response to application of a voltage. The piezoelectric layer 70 is not limited to PZT, and other ferroelectric piezoelectric materials, relaxor ferroelectric materials in which a metal such as niobium, nickel, magnesium, bismuth, or yttrium is added to the ferroelectric piezoelectric material, and the like may be used.

The first electrode 60 is a common electrode of the piezoelectric element 32 disposed below the piezoelectric layer 70, and the second electrode 80 is an individual electrode of the piezoelectric element 32 disposed above the piezoelectric layer 70. The lead electrode 90 is coupled to the second electrode 80. A driving signal output from the driving circuit 126 is supplied to the second electrode 80 via the flexible cable 120 and the lead electrode 90. A voltage is applied to the piezoelectric layer 70 by the first electrode 60 and the second electrode 80 to deform the piezoelectric layer 70. In this regard, the first electrode 60 disposed below the piezoelectric layer 70 may be set to be an individual electrode, and the second electrode 80 disposed above the piezoelectric layer 70 may be set to be a common electrode.

The vibrating plate 50 is arranged at the upper surface of the flow-passage-forming substrate 10 while being in contact with the actuator 300. The vibrating plate 50 is vibrated in response to actuation of the piezoelectric element 32, that is, deformation of the piezoelectric layer 70, so as to apply pressure to the ink in the pressure chamber 12. The ink is ejected from the nozzle 21 by the pressure fluctuations of the ink in the pressure chamber 12 being transferred to the ink in the second flow passage 202 and the first flow passage 201.

The vibrating plate 50 includes the insulator film 51 and the elastic film 52. The elastic film 52 is a layer containing silicon dioxide ($SiO_2$). In the present embodiment, the primary component of the elastic film 52 is silicon dioxide ($SiO_2$), and an impurity element may be contained. The elastic film 52 is also referred to as a "first layer 52". The thickness of the elastic film 52 may be set to be 0.1 µm or more and 0.5 µm or less.

The elastic film 52 is arranged at the flow-passage-forming substrate 10 and blocks the opening on the upper-surface side of the flow-passage-forming substrate 10. The insulator film 51 containing zirconium oxide ($ZrO_2$) is stacked on the elastic film 52. The insulator film 51 is also referred to as a "second layer 51". In the present embodiment, the primary component of the insulator film 51 is zirconium oxide ($ZrO_2$), and an impurity element described later may be contained. The thickness of the insulator film 51 may be set to be 0.1 µm or more and 1.2 µm or less. In the present embodiment, the $ZrO_2$ constituting the insulator film 51 is in a state in which the (−111) crystal face faces the surface of the insulator film 51 and has a columnar crystal structure. The crystal being columnar denotes the state in which crystals in the shape of a substantially circular column are gathered in the surface direction and form a film while the center axes are substantially in accord with the thickness direction. In this regard, the $ZrO_2$ constituting the insulator film 51 has a monoclinic crystal structure.

In the present embodiment, to change the crystal structure of the insulator film 51, the insulator film 51 contains, for example, a total amount of less than 10% by mass of impurity elements, as described later. Examples of the impurity element include chromium (Cr), iron (Fe), titanium (Ti), and hafnium (Hf). The impurity element in an atomic form may be present in a $ZrO_2$ crystal, or the impurity element in a molecular form such as an oxide, other than the $ZrO_2$ crystal, may be present in the insulator film 51. In the present embodiment, Cr is present as chromium(II) oxide represented by a composition formula CrO, and Fe is present as iron(II) oxide represented by a composition formula FeO. Ti is present as titanium monoxide represented by a composition formula TiO. Cr may be present as chromium(III) oxide represented by a composition formula $Cr_2O_3$, chromium(IV) oxide represented by a composition formula $CrO_2$, chromium(VI) oxide represented by a composition formula $CrO_3$, and Ti may be present as titanium dioxide represented by a composition formula $TiO_2$ or titanium (III) oxide represented by a composition formula $Ti_2O_3$. Hf may be present as hafnium oxide represented by a composition formula $HfO_2$.

Regarding the method for forming the vibrating plate 50, a silicon wafer for forming the flow-passage-forming substrate 10 is subjected to thermal oxidation in a diffusion furnace at substantially 1,100 degrees Celsius so as to form a silicon dioxide film serving as the elastic film 52 on the surface. A zirconium (Zr) layer is formed on the resulting elastic film 52 by using, for example, a sputtering method and by performing thermal oxidation in a diffusion furnace at 500 degrees Celsius or higher and 1,200 degrees Celsius or lower so as to form the insulator film 51 containing zirconium oxide. Examples of the method for an impurity element to be contained in the insulator film 51 include a method in which, when the insulator film 51 is formed by using the sputtering method, the insulator film 51 is formed through sputtering by using a target already containing the impurity element. The concentration of the impurity element contained in the insulator film 51 can be controlled by increasing or decreasing the concentration of the impurity element in the sputtering target. Specifically, the concentration of the impurity element can be increased by increasing the concentration of the impurity element in the sputtering target. Examples of the method for changing the crystal structure of the insulator film 51 include a method in which the insulator film 51 is doped with the impurity element and a method in which the condition for a film formation step of the insulator film 51 is changed, the condition including the film thickness of a $ZrO_2$ film serving as the insulator film 51, the temperature condition of thermal oxidation, and the like.

Figure 4:
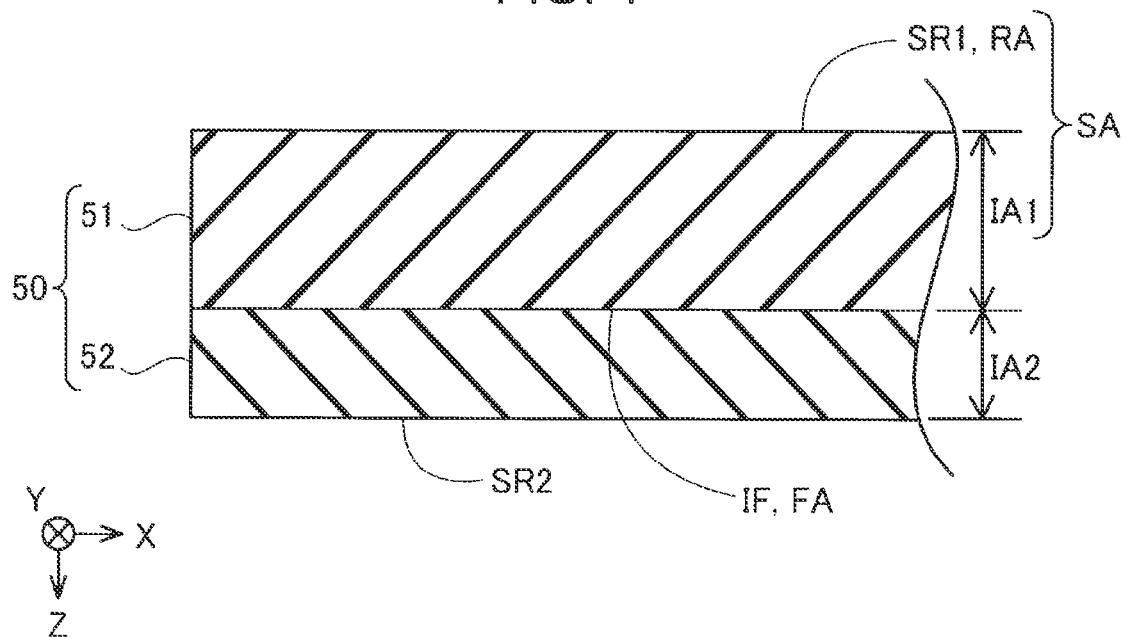
FIG. 4 is an enlarged explanatory diagram illustrating a vibrating plate.

FIG. 4 is an enlarged explanatory diagram illustrating region IV in FIG. 3. For the sake of facilitating understanding of the technology, members other than the vibrating plate 50 are omitted from FIG. 4. The insulator film 51 includes an interface region FA in contact with the elastic film 52 and a surface-layer region SA opposite to the elastic film 52 with the interface region FA interposed therebetween. In the insulator film 51, the interface region FA is a region delimited by the interface IF in contact with the elastic film 52. The interface region FA includes not only the interface IF but also part of the region contiguous from the surface in contact with the elastic film 52 to the surface SR1 of the insulator film 51. In general, the interface of a multilayer body in which a plurality of layers are stacked may become a cracking start point and may become the reason for causing a deterioration in the strength of the multilayer body.

A surface region RA in the insulator film 51 is a region delimited by the surface SR1 opposite to the interface IF. The surface region RA includes not only the surface SR1 but also part of the region contiguous from the surface SR1 to the interface IF. A surface-layer region SA includes the surface region RA and an internal region IA1 located between the surface region RA and the interface region FA. That is, the surface-layer region SA is a region other than the interface region FA in the insulator film 51. As illustrated in FIG. 3, the surface SR1 of the insulator film 51 is a surface in contact with the piezoelectric element 32. FIG. 4 schematically illustrates the surface SR2 of the elastic film 52 and an internal region IA2 of the elastic film 52.

In the present embodiment, the interface region FA of the insulator film 51 includes a region in which a first intensity that is the degree of orientation of the (−211) crystal face based on the X-ray diffraction pattern is higher than a second intensity that is the degree of orientation of the (−111) crystal face based on the X-ray diffraction pattern and in which the first intensity is higher than a third intensity that is the degree of orientation of the (002) crystal face based on the X-ray diffraction pattern. The degree of orientation may be evaluated based on the peak intensity in the X-ray diffraction pattern or may be evaluated based on the integrated intensity of the peak included in the half-width. In the following explanations, examples in which evaluation is performed based on the peak intensity are used. Incidentally, the surface-layer region SA of the insulator film 51 includes a region in which the first intensity is higher than the third intensity and in which the second intensity is higher than the third intensity. Consequently, the interface region FA of the insulator film 51 that tends to become a cracking start point has residual compressive stress. Therefore, the strength of the interface region FA of the insulator film 51 can be improved, and the strength of the vibrating plate 50 can be improved.

The examples and the comparative examples of the vibrating plate 50 included in the liquid ejecting head 1 according to the present embodiment will be described with reference to FIG. 5 to FIG. 17. FIG. 5 to FIG. 16 illustrate the results of X-ray diffraction analysis of the insulator film 51 included in the vibrating plate 50. In FIG. 5 to FIG. 16, the horizontal axis represents an X-ray acceptance angle, and the vertical axis represents X-ray diffraction intensity (cps). X-ray diffraction analysis was performed based on thin film X-ray diffraction by using a multi-axis X-ray diffractometer. Specifically, Cu was used as the X-ray source, and an out-of-plane measurement by using a CuKα ray with a wavelength of 1.5418 Å as a characteristic X-ray was performed. Regarding the detection angle of diffracted X-rays, 2θ=20 degrees to 50 degrees and γ=−95 degrees to −85 degrees, and multi-axis diffraction by using a 0-dimensional detector was performed where the 2θ-axis=35 degrees, the ω-axis=10 degrees, the χ (chi)-axis=90 degrees, and the φ (phi)-axis=0 degrees.

For the analysis by using an X-ray diffraction method, samples of four types of the vibrating plates 50 including a sample of a comparative example were used. More specifically, the samples were Sample SR as a comparative example in which the insulator film 51 not containing an impurity element was formed on the elastic film 52 and First sample S1, Second sample S2, and Third sample S3, in which three types of insulator films 51 containing an impurity element were formed on the elastic film 52. First sample S1, Second sample S2, and Third sample S3 differ from each other in the thickness of the insulator film 51. Specifically, the thickness of the insulator film 51 of Samples S1, S2, and S3 was 400 nm, 650 nm, and 900 nm, respectively. The method for forming each sample of the vibrating plate 50 was the same as the above. That is, a silicon dioxide film serving as the elastic film 52 was formed on the surface of the silicon wafer serving as the substrate. Regarding Sample SR, a Zr layer was formed on the resulting elastic film 52 through sputtering by using a target not containing an impurity element. Regarding Samples S1, S2, and S3, the respective Zr layers were formed by using a target already containing an impurity element and performing sputtering in accordance with the respective intended thicknesses. The sputtering targets used for producing Samples S1, S2, and S3 were the same, and the concentrations of the impurity element were equal. Regarding the thickness of each sample, First sample S1<Second sample S2<Third sample S3. Regarding the concentration of the impurity element of each sample, First sample S1=Second sample S2=Third sample S3. Therefore, regarding the content of the impurity element in each sample, First sample S1<Second sample S2<Third sample S3. The resulting Zr layer was subjected to thermal oxidation so as to form the insulator film 51 containing zirconium oxide. In this regard, each sample was measured in a state of being disposed on the silicon substrate.

Figure 5:
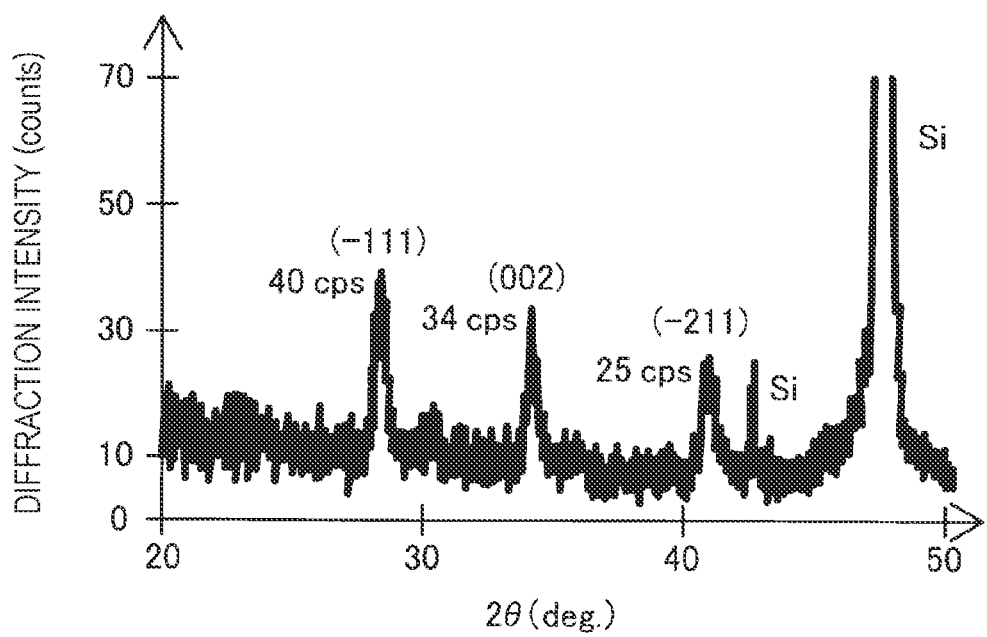
FIG. 5 is a graph illustrating an X-ray diffraction pattern at the surface of an insulator film of a comparative example.
Figure 6:
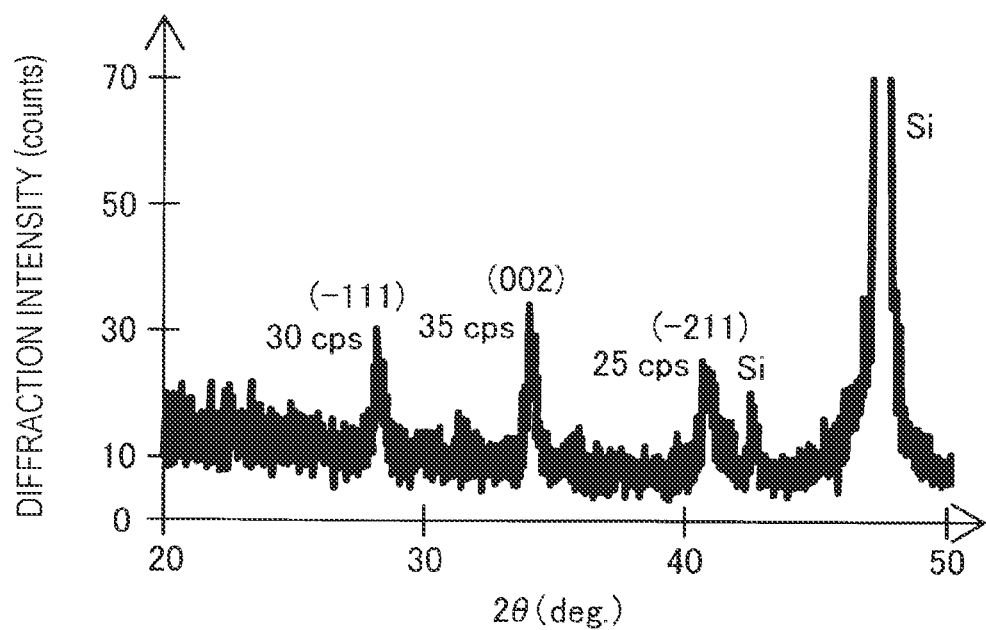
FIG. 6 is a graph illustrating an X-ray diffraction pattern in the internal region of an insulator film of a comparative example.
Figure 7:
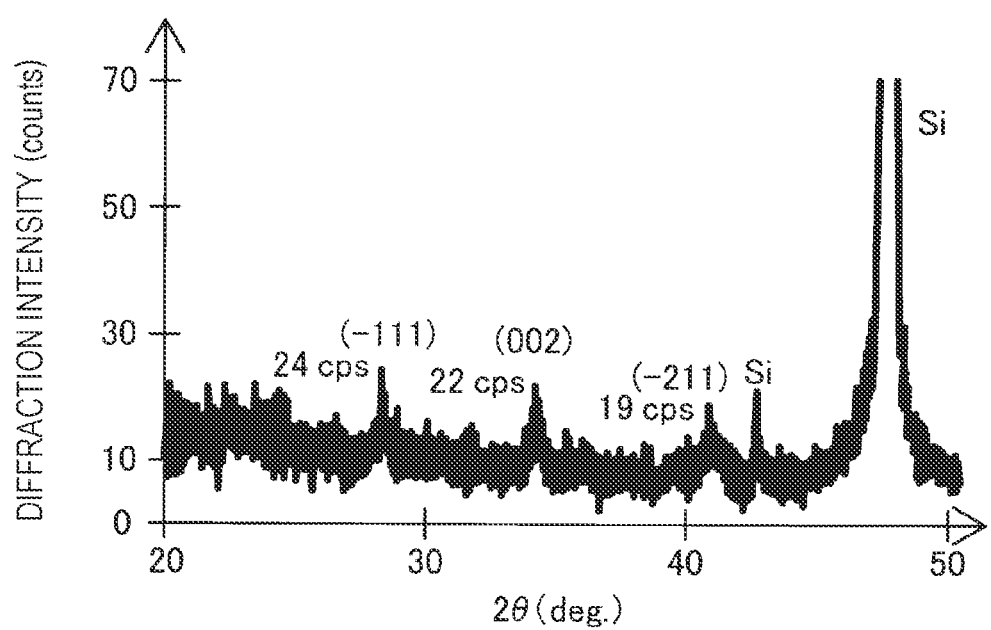
FIG. 7 is a graph illustrating an X-ray diffraction pattern at the interface of an insulator film of a comparative example.

FIG. 5 to FIG. 7 illustrate the measurement results of Sample SR of the vibrating plate 50 serving as the comparative example. FIG. 5 is a graph illustrating an X-ray diffraction pattern in the surface region RA of the insulator film 51 of Sample SR. FIG. 6 is a graph illustrating an X-ray diffraction pattern in the internal region IA1 of the insulator film 51 of Sample SR. FIG. 7 is a graph illustrating an X-ray diffraction pattern in the interface region FA of the insulator film 51 of Sample SR.

As illustrated in FIG. 5 to FIG. 7, in the surface region RA of the insulator film 51 of Sample SR, a peak in the X-ray diffraction pattern of the (−211) crystal face, a peak in the X-ray diffraction pattern of the (−111) crystal face, and a peak in the X-ray diffraction pattern of the (002) crystal face were detected. The monoclinic (−111) crystal face of $ZrO_2$ serving as the insulator film 51 was detected as an intensity peak at 2θ=27.5 to 28.5 degrees in the X-ray diffraction. Each crystal face was a crystal face detected in the film thickness direction of the vibrating plate 50, that is, in the stacking direction. The monoclinic (002) crystal face was detected as a peak at 2θ=33.5 to 34.5 degrees, and the monoclinic (−211) crystal face was detected as a peak at 2θ=40.5 to 41.5 degrees. In this regard, peaks detected at substantially 42.5 degrees and 47 degrees are peaks derived from Si of the silicon substrate. The peak intensity of the (−211) crystal face in the X-ray diffraction pattern is also referred to as first intensity, the peak intensity of the (−111) crystal face in the X-ray diffraction pattern is also referred to as second intensity, and the peak intensity of the (002) crystal face in the X-ray diffraction pattern is also referred to as third intensity. The ratio of the peak intensity serving as the second intensity to the peak intensity serving as the first intensity is also referred to as a first ratio, and the ratio of the peak intensity serving as the third intensity to the peak intensity serving as the first intensity is also referred to as a second ratio.

As illustrated in FIG. 5, the first intensity in the surface region RA of Sample SR is 25, the second intensity is 40, the third intensity is 34, the first ratio is 1.60, and the second ratio is 1.36. In the surface region RA of Sample SR, the first intensity is lower than the second intensity, and the first intensity is lower than the third intensity. As illustrated in FIG. 6, in the internal region IA1 of Sample SR, the first intensity is 25, the second intensity is 30, the third intensity is 35, the first ratio is 1.20, and the second ratio is 1.40. In the internal region IA1 of Sample SR, the first intensity is lower than the second intensity, and the first intensity is lower than the third intensity. That is, as illustrated in FIG. 5 and FIG. 6, in the surface-layer region SA of Sample SR, the first intensity is lower than the third intensity, and the second intensity is lower than the third intensity. As illustrated in FIG. 7, the first intensity in the interface region FA of Sample SR is 19, the second intensity is 24, the third intensity is 22, the first ratio is 1.26, and the second ratio is 1.16. In the interface region FA of Sample SR, the first intensity is lower than the second intensity, and the first intensity is lower than the third intensity.

Figure 8:
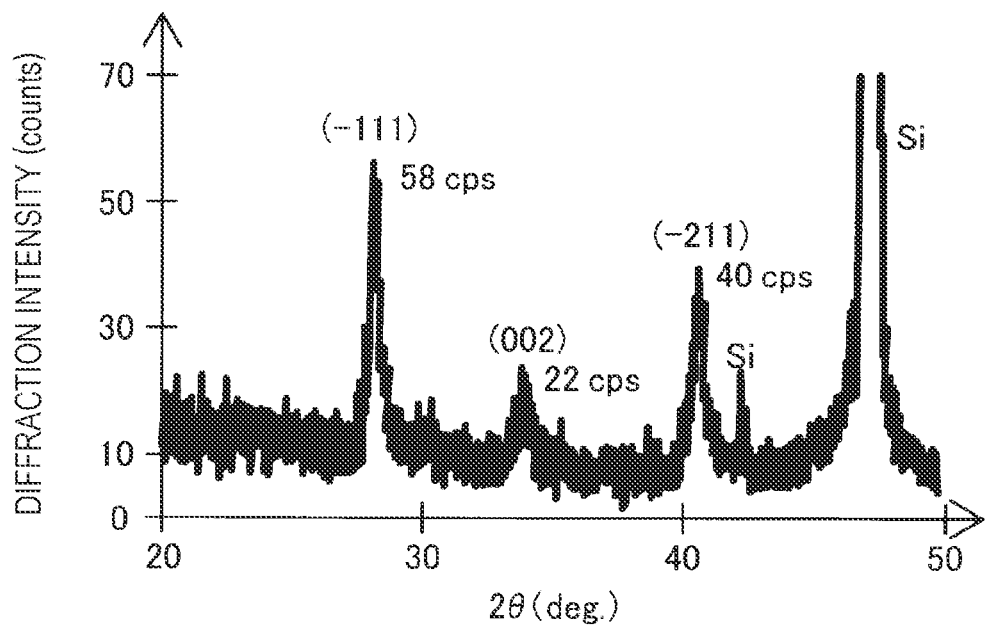
FIG. 8 is a graph illustrating an X-ray diffraction pattern at the surface of an insulator film of a first sample.
Figure 9:
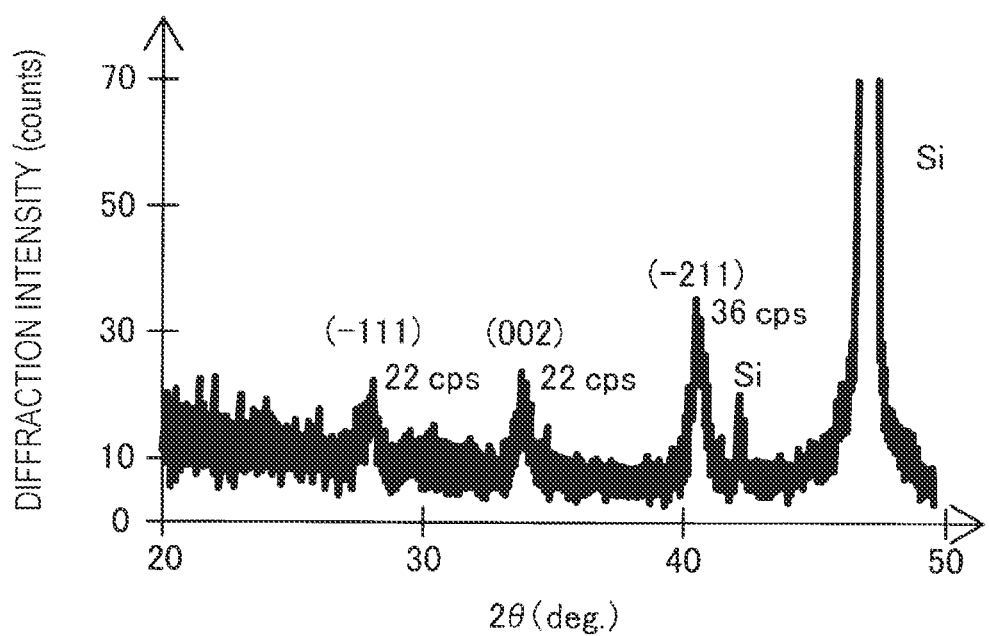
FIG. 9 is a graph illustrating an X-ray diffraction pattern in the internal region of an insulator film of the first sample.
Figure 10:
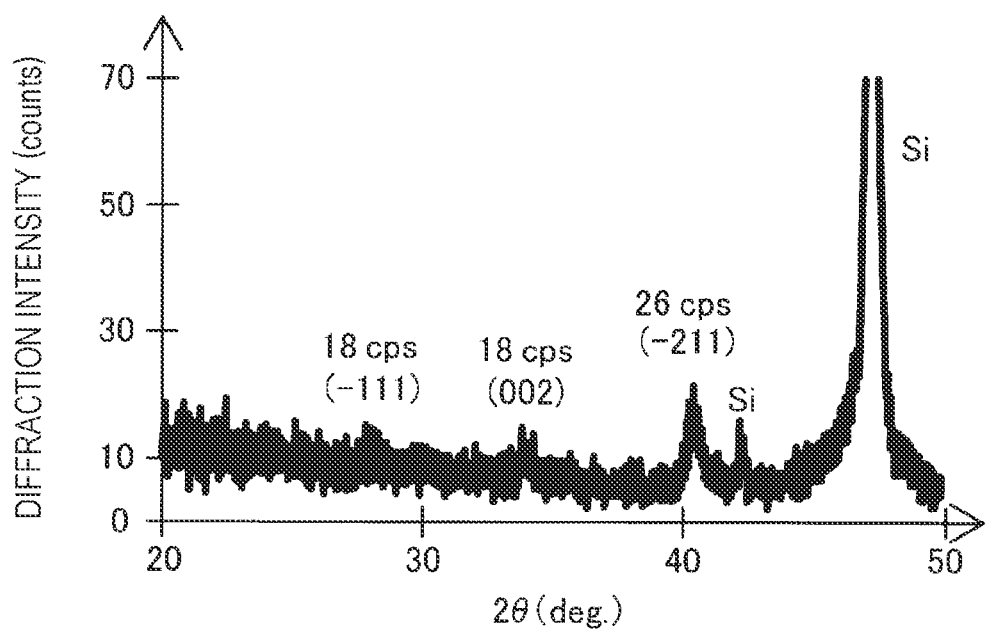
FIG. 10 is a graph illustrating an X-ray diffraction pattern at the interface of an insulator film of the first sample.

FIG. 8 to FIG. 10 illustrate the measurement results of First sample S1 that is the vibrating plate 50 including the insulator film 51 having a thickness of 400 nm. FIG. 8 is a graph illustrating an X-ray diffraction pattern in the surface region RA of the insulator film 51 of First sample S1. FIG. 9 is a graph illustrating an X-ray diffraction pattern in the internal region IA1 of the insulator film 51 of First sample S1. FIG. 10 is a graph illustrating an X-ray diffraction pattern in the interface region FA of the insulator film 51 of First sample S1.

As illustrated in FIG. 8, the first intensity in the surface region RA of First sample S1 is 40, the second intensity is 58, the third intensity is 22, the first ratio is 1.45, and the second ratio is 0.55. In the surface region RA of First sample S1, the first intensity is lower than the second intensity, and the first intensity is higher than the third intensity. As illustrated in FIG. 9, in the internal region IA1 of First sample S1, the first intensity is 36, the second intensity is 22, the third intensity is 22, the first ratio is 0.61, and the second ratio is 0.61. In the internal region IA1 of First sample S1, the first intensity is higher than the second intensity, and the first intensity is higher than the third intensity. That is, the surface-layer region SA of First sample S1 includes a region in which the first intensity is higher than the third intensity, and the second intensity is higher than the third intensity. As illustrated in FIG. 10, the first intensity in the interface region FA of First sample S1 is 26, the second intensity is 18, the third intensity is 18, the first ratio is 0.69, and the second ratio is 0.69. In the interface region FA of First sample S1, the first intensity is higher than the second intensity, and the first intensity is higher than the third intensity. As illustrated in FIG. 8 and FIG. 10, in First sample S1, the first ratio in the interface region FA is 0.69 and is smaller than the first ratio (1.45) in the surface region RA in the surface-layer region SA. In addition, in First sample S1, the second ratio in the interface region FA is 0.69 and is larger than the second ratio (0.55) in the surface region RA in the surface-layer region SA.

Figure 11:
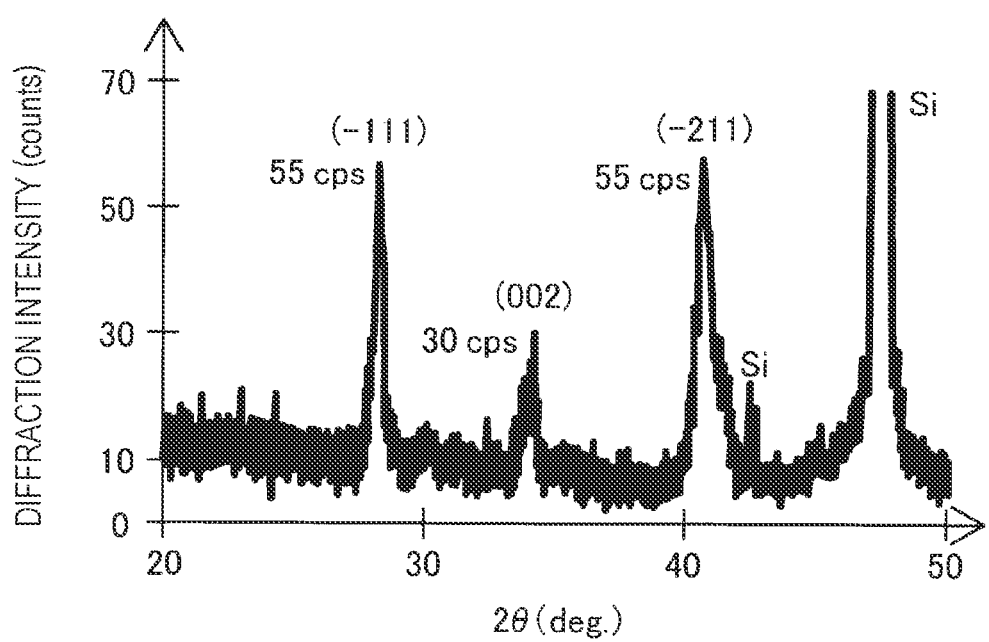
FIG. 11 is a graph illustrating an X-ray diffraction pattern at the surface of an insulator film of a second sample.
Figure 12:
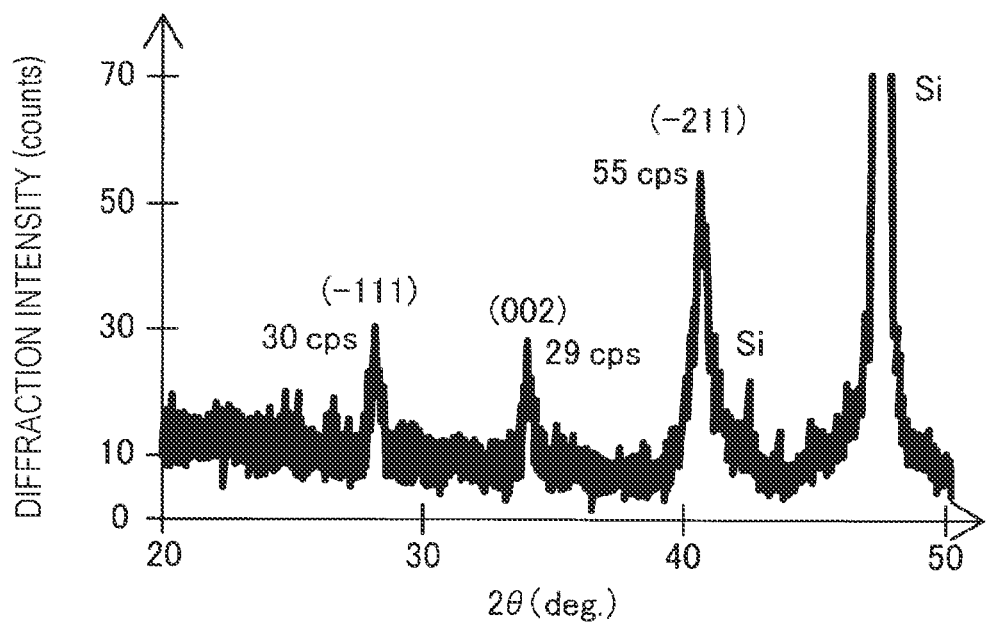
FIG. 12 is a graph illustrating an X-ray diffraction pattern in the internal region of an insulator film of the second sample.
Figure 13:
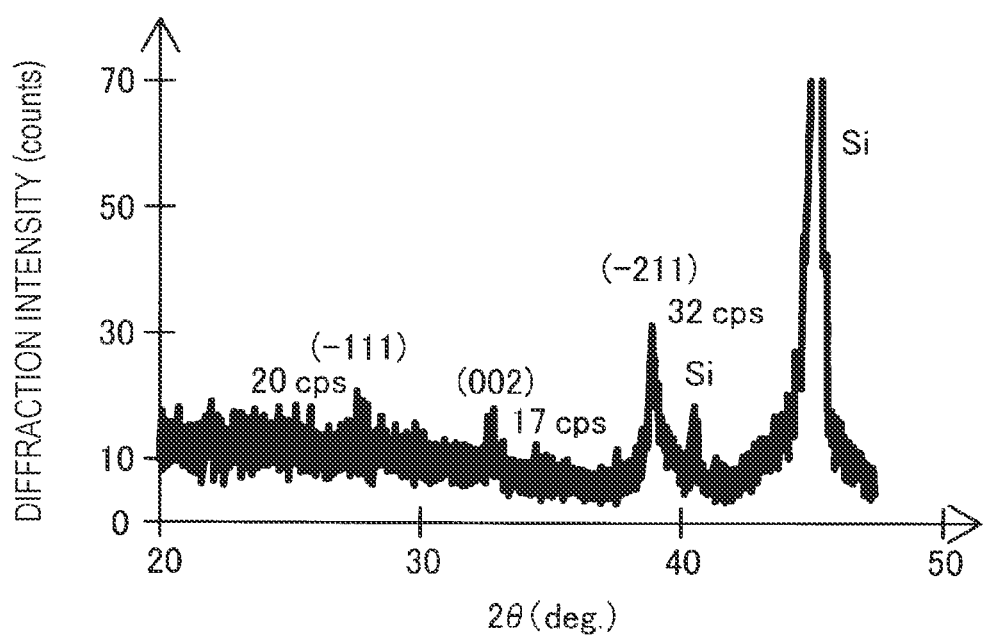
FIG. 13 is a graph illustrating an X-ray diffraction pattern at the interface of an insulator film of the second sample.

FIG. 11 to FIG. 13 illustrate the measurement results of Second sample S2 that is the vibrating plate 50 including the insulator film 51 having a thickness of 650 nm. FIG. 11 is a graph illustrating an X-ray diffraction pattern in the surface region RA of the insulator film 51 of Second sample S2. FIG. 12 is a graph illustrating an X-ray diffraction pattern in the internal region IA1 of the insulator film 51 of Second sample S2. FIG. 13 is a graph illustrating an X-ray diffraction pattern in the interface region FA of the insulator film 51 of Second sample S2.

As illustrated in FIG. 11, the first intensity in the surface region RA of Second sample S2 is 55, the second intensity is 55, the third intensity is 30, the first ratio is 1.00, and the second ratio is 0.55. In the surface region RA of Second sample S2, the first intensity is substantially equal to the second intensity, and the first intensity is higher than the third intensity. As illustrated in FIG. 12, in the internal region IA1 of Second sample S2, the first intensity is 55, the second intensity is 30, the third intensity is 29, the first ratio is 0.55, and the second ratio is 0.53. In the internal region IA1 of Second sample S2, the first intensity is higher than the second intensity, and the first intensity is higher than the third intensity. That is, as illustrated in FIG. 11 and FIG. 12, the surface-layer region SA of Second sample S2 includes a region in which the first intensity is higher than the third intensity, and the second intensity is higher than the third intensity. As illustrated in FIG. 13, the first intensity in the interface region FA of Second sample S2 is 32, the second intensity is 20, the third intensity is 17, the first ratio is 0.63, and the second ratio is 0.53. In the interface region FA of Second sample S2, the first intensity is higher than the second intensity, and the first intensity is higher than the third intensity. As illustrated in FIG. 11 and FIG. 13, in Second sample S2, the first ratio in the interface region FA is 0.63 and is smaller than the first ratio (1.00) in the surface region RA in the surface-layer region SA. In addition, in Second sample S2, the second ratio in the interface region FA is 0.53 and is smaller than the second ratio (0.55) in the surface region RA in the surface-layer region SA.

Figure 14:
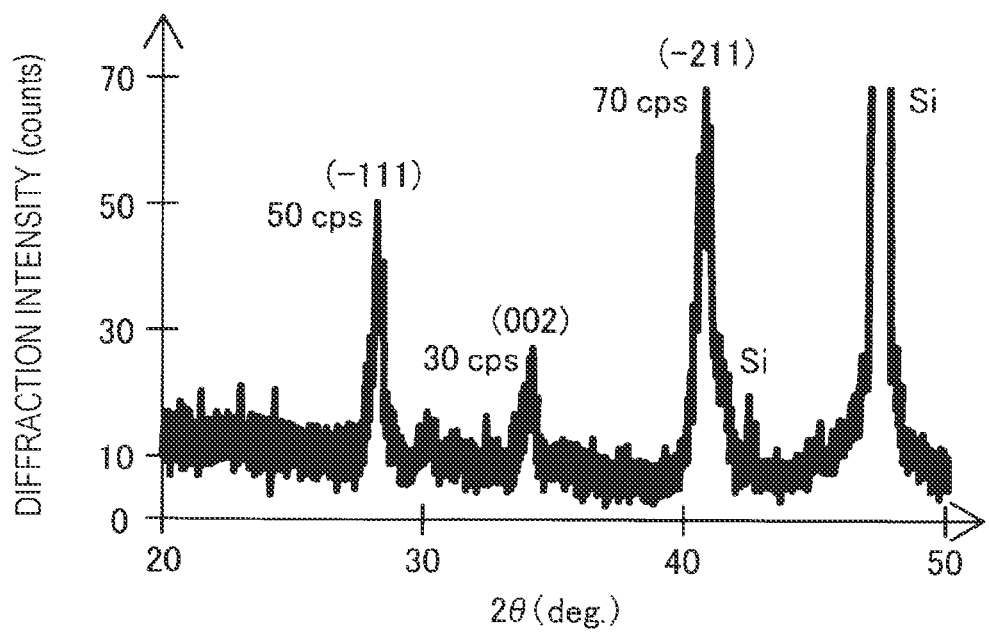
FIG. 14 is a graph illustrating an X-ray diffraction pattern at the surface of an insulator film of a third sample.
Figure 15:
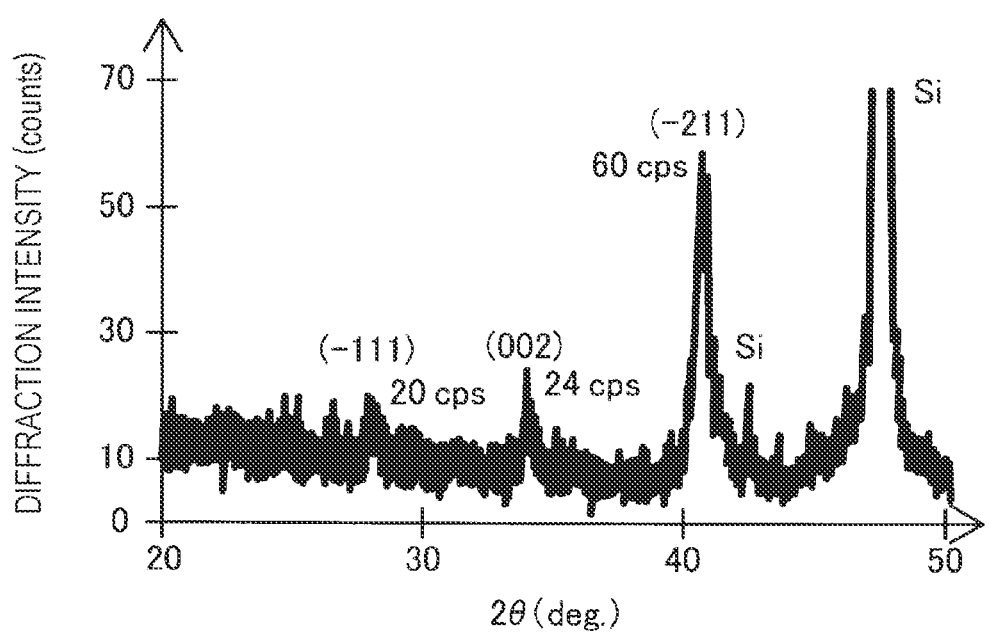
FIG. 15 is a graph illustrating an X-ray diffraction pattern in the internal region of an insulator film of the third sample.
Figure 16:
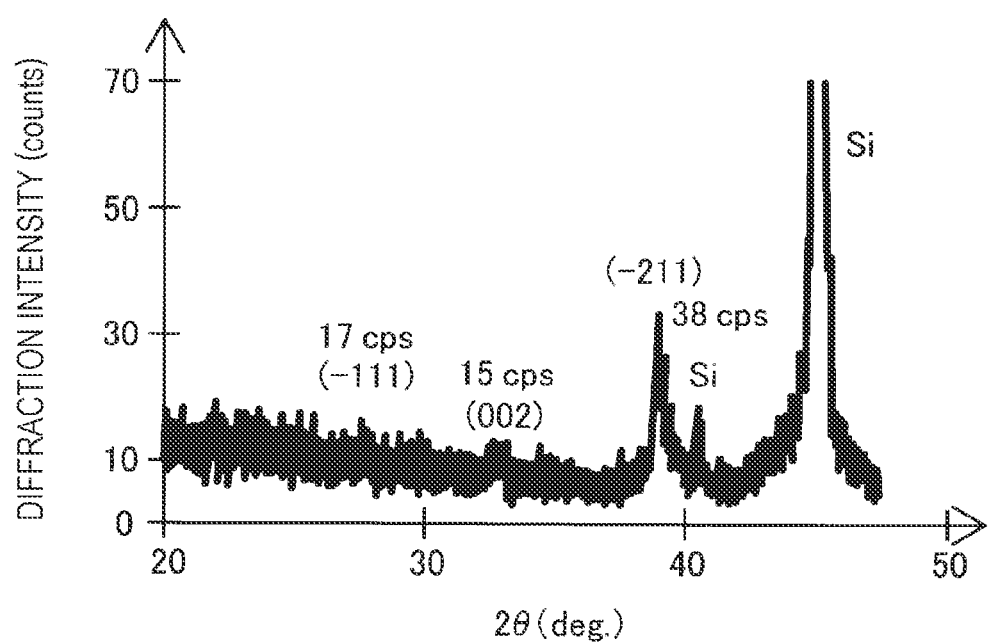
FIG. 16 is a graph illustrating an X-ray diffraction pattern at the interface of an insulator film of the third sample.

FIG. 14 to FIG. 16 illustrate the measurement results of Third sample S3 that is the vibrating plate 50 including the insulator film 51 having a thickness of 900 nm. FIG. 14 is a graph illustrating an X-ray diffraction pattern in the surface region RA of the insulator film 51 of Third sample S3. FIG. 15 is a graph illustrating an X-ray diffraction pattern in the internal region IA1 of the insulator film 51 of Third sample S3. FIG. 16 is a graph illustrating an X-ray diffraction pattern in the interface region FA of the insulator film 51 of Third sample S3.

As illustrated in FIG. 14, the first intensity in the surface region RA of Third sample S3 is 70, the second intensity is 50, the third intensity is 30, the first ratio is 0.71, and the second ratio is 0.43. In the surface region RA of Third sample S3, the first intensity is higher than the second intensity, and the first intensity is higher than the third intensity. As illustrated in FIG. 15, in the internal region IA1 of Third sample S3, the first intensity is 60, the second intensity is 20, the third intensity is 24, the first ratio is 0.33, and the second ratio is 0.40. In the internal region IA1 of Third sample S3, the first intensity is higher than the second intensity, and the first intensity is higher than the third intensity. That is, as illustrated in FIG. 14 and FIG. 15, the surface-layer region SA of Third sample S3 includes a region in which the first intensity is higher than the third intensity, and the second intensity is higher than the third intensity. As illustrated in FIG. 16, the first intensity in the interface region FA of Third sample S3 is 38, the second intensity is 17, the third intensity is 15, the first ratio is 0.45, and the second ratio is 0.39. In the interface region FA of Third sample S3, the first intensity is higher than the second intensity, and the first intensity is higher than the third intensity. As illustrated in FIG. 14 and FIG. 16, in Third sample S3, the first ratio in the interface region FA is 0.45 and is smaller than the first ratio (0.71) in the surface region RA in the surface-layer region SA. In addition, in Third sample S3, the second ratio in the interface region FA is 0.39 and is smaller than the second ratio (0.43) in the surface region RA in the surface-layer region SA.

Figure 17:
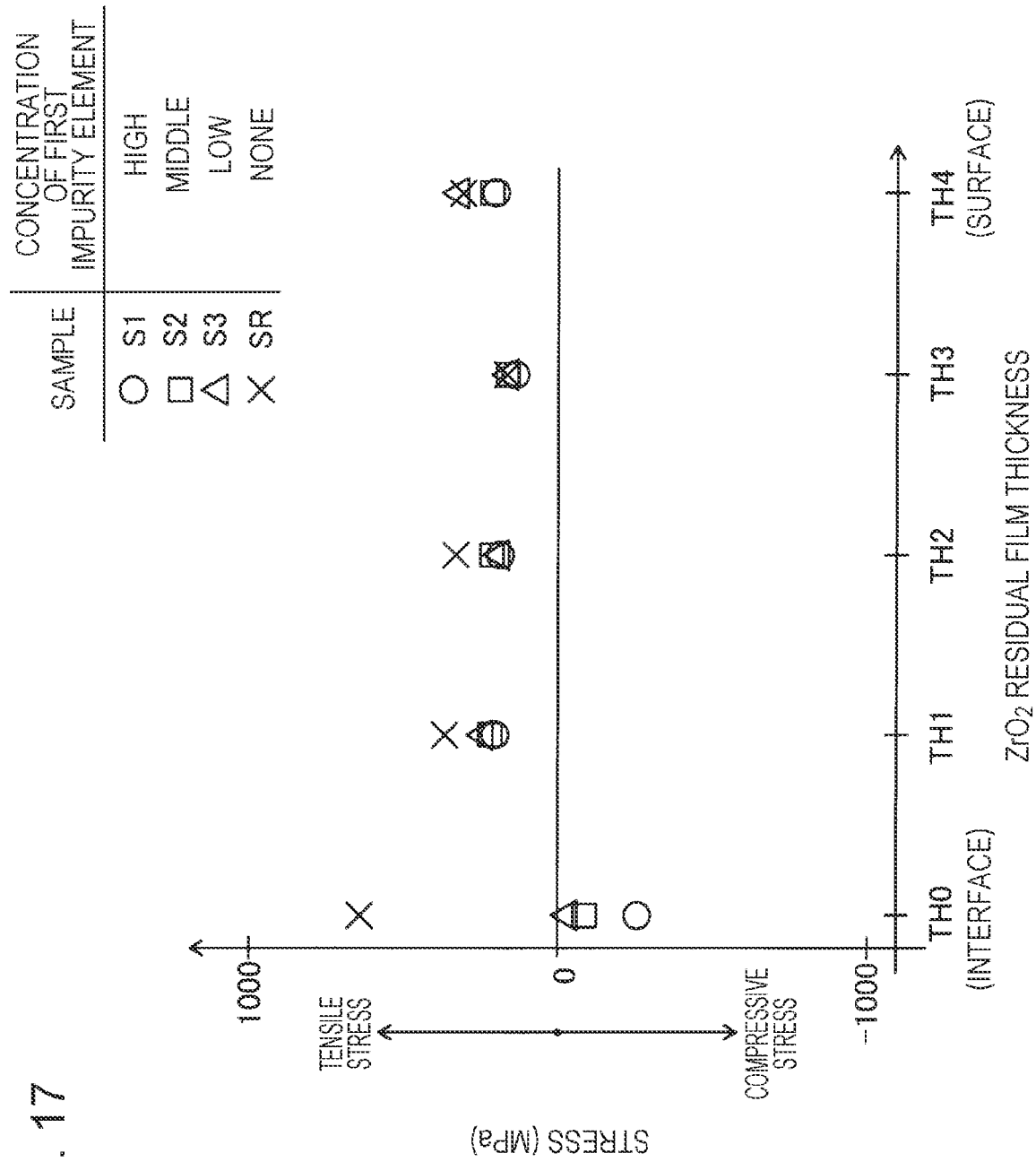
FIG. 17 is an explanatory diagram illustrating the film thickness of an insulator film versus the distribution of the residual stress.

FIG. 17 is an explanatory diagram illustrating the film thickness of the insulator film 51 versus the distribution of the residual stress. FIG. 17 illustrates the measurement results of the residual stress of Sample SR serving as the comparative example of the vibrating plate 50 and Samples S1 to S3 that differ from each other in the thickness of the vibrating plate 50 of the insulator film 51. The horizontal axis of FIG. 17 represents the film thickness from the interface region FA to the surface region RA of the insulator film 51, and the vertical axis of FIG. 17 represents the residual stress of the insulator film 51. The residual stress was measured by using a thin film stress measuring apparatus. The residual stress was obtained by acquiring the curvature of a sample and performing conversion to the stress. The residual stress of each sample of the insulator film 51 was measured after the residual film thickness TH4 as the surface region RA of the insulator film 51 was cut up to each of the residual film thicknesses TH1, TH2, and TH3 as the internal region IA1 and up to the residual thickness TH0 as the interface region FA through ion milling by using argon ions.

As illustrated by Sample SR in FIG. 17, the residual stress of each of the interface region FA to the surface region RA of the insulator film 51 is tensile stress. On the other hand, regarding Samples S1 to S3 at the residual film thickness TH0, as illustrated in FIG. 17, the interface regions FA of Samples S1 to S3 of the insulator films 51 have compressive stress. The compressive stress of the interface region FA increases as the thickness of the insulator film 51 increases and becomes maximum regarding Third sample S3 in which the thickness of the insulator film 51 is the greatest. Regarding Samples S1 to S3, the residual stress of the surface-layer region SA other than the interface region FA, that is, surface region RA of the insulator film 51, at each of the residual film thickness TH4 and the residual stress of the internal region IA1 at the residual film thicknesses TH1, TH2, and TH3 is tensile stress. Regarding Samples S1 to S3, the tensile stress in the surface region RA is greater than the tensile stress in the internal region IA1.

As described above, according to the liquid ejecting head 1 of the present embodiment, the interface region FA of the insulator film 51 includes a region in which the first intensity that is the peak intensity of the (−211) crystal face based on the X-ray diffraction pattern is higher than the second intensity that is the peak intensity of the (−111) crystal face based on the X-ray diffraction pattern and in which the first intensity is higher than the third intensity that is the peak intensity of the (002) crystal face based on the X-ray diffraction pattern. The surface-layer region SA of the insulator film 51 includes a region in which the first intensity is higher than the third intensity and in which the second intensity is higher than the third intensity. Consequently, the interface region FA of the insulator film 51 that tends to become a cracking start point has residual compressive stress. Therefore, the strength of the interface region FA of the insulator film 51 can be improved and the strength of the vibrating plate 50 can be improved.

According to the liquid ejecting head 1 of the present embodiment, as indicated by Second sample S2 and Third sample S3, regarding the insulator film 51 having a thickness of 650 nm to a thickness of 900 nm, the first ratio in the interface region FA of the insulator film 51 is smaller than the first ratio in the surface-layer region SA of the insulator film 51. Therefore, the liquid ejecting head 1 including a vibrating plate 50 in which the first ratio in the interface region FA of the insulator film 51 is smaller than the first ratio in the surface-layer region SA of the insulator film 51 can be obtained.

According to the liquid ejecting head 1 of the present embodiment, the first ratio in the interface region FA of the insulator film 51 is 0.4 or more and 0.7 or less. Therefore, the liquid ejecting head 1 including the vibrating plate 50 in which the first ratio in the interface region FA of the insulator film 51 is 0.4 or more and 0.7 or less can be obtained.

According to the liquid ejecting head 1 of the present embodiment, the surface-layer region SA of the insulator film 51 includes a region in which the first ratio is 0.3 or more and 0.7 or less. Therefore, the liquid ejecting head 1 including the vibrating plate 50 including a region in which the first ratio is 0.3 or more and 0.7 or less can be obtained.

According to the liquid ejecting head 1 of the present embodiment, as indicated by Second sample S2 and Third sample S3, regarding a thickness of 650 nm to a thickness of 900 nm, the second ratio in the interface region FA of the insulator film 51 is smaller than the second ratio in the surface-layer region SA of the insulator film 51. Therefore, the liquid ejecting head 1 including a vibrating plate 50 in which the second ratio in the interface region FA of the insulator film 51 is smaller than the second ratio in the surface-layer region SA of the insulator film 51 can be obtained.

According to the liquid ejecting head 1 of the present embodiment, the second ratio in the interface region FA of the insulator film 51 is 0.3 or more and 0.7 or less. Therefore, the liquid ejecting head 1 including the vibrating plate 50 in which the second ratio in the interface region FA of the insulator film 51 is 0.3 or more and 0.7 or less can be obtained.

According to the liquid ejecting head 1 of the present embodiment, the surface-layer region SA of the insulator film 51 includes a region in which the second ratio is 0.4 or more and 0.7 or less. Therefore, the liquid ejecting head 1 including the vibrating plate 50 in which the second ratio in the surface-layer region SA of the insulator film 51 is 0.4 or more and 0.7 or less can be obtained.

According to the liquid ejecting head 1 of the present embodiment, in the interface region FA, the third intensity is lower than or equal to the second intensity. Therefore, the liquid ejecting head 1 including the vibrating plate 50 in which the third intensity in the interface region FA is lower than or equal to the second intensity can be obtained.

According to the liquid ejecting head 1 of the present embodiment, the $ZrO_2$ constituting the insulator film 51 has a columnar crystal structure. Therefore, the adhesiveness between the insulator film 51 and the elastic film 52 can be improved, and peeling and the like of the vibrating plate 50 can be suppressed or prevented from occurring.

According to the liquid ejecting head 1 of the present embodiment, the $ZrO_2$ constituting the insulator film 51 has a monoclinic crystal structure. Therefore, the adhesiveness between the insulator film 51 and the elastic film 52 can be improved, and peeling and the like of the vibrating plate 50 can be suppressed or prevented from occurring.

According to the liquid ejecting head 1 of the present embodiment, the interface region FA of the insulator film 51 has compressive stress. Therefore, the strength of the vibrating plate 50 can be improved by providing residual compressive stress in the interface region FA, which tends to be a cracking start point. In addition, the surface-layer region SA having the residual tensile stress enables the residual stress balance of the overall insulator film 51 to be appropriate and enables the vibrating plate 50 having higher strength to be obtained.

B. Other Embodiments

The present disclosure is not limited to the above-described embodiment and may be realized in various forms within the bounds of not departing from the scope of the disclosure. For example, the present disclosure may be realized in the following aspects. The technical features in the above-described embodiment corresponding to the technical features in the aspects described below may be appropriately exchanged or combined to address some of or all the problems of the present disclosure or to achieve some of or all the effects of the present disclosure. In this regard, the technical features that are not specified to be indispensable in the specification may be appropriately skipped.

(1) According to an aspect of the present disclosure, a liquid ejecting head is provided. The liquid ejecting head includes a piezoelectric element and a vibrating plate configured to vibrate in response to actuation of the piezoelectric element, the vibrating plate including a first layer that contains $SiO_2$ and a second layer that contains $ZrO_2$ and that is stacked on the first layer. The second layer includes an interface region in contact with the first layer and a surface-layer region opposite to the first layer with the interface region interposed therebetween, and the interface region may include a region in which first intensity is higher than second intensity and in which the first intensity is higher than third intensity, where a degree of orientation of the (−211) crystal face of the second layer, measured by using an X-ray diffraction method, is denoted as the first intensity, the degree of orientation of the (−111) crystal face of the second layer, measured by using the X-ray diffraction method, is denoted as the second intensity, and the degree of orientation of the (002) crystal face of the second layer, measured by using the X-ray diffraction method, is denoted as the third intensity. The surface-layer region may include a region in which the first intensity is higher than the third intensity and in which the second intensity is higher than the third intensity. According to the liquid ejecting head of the present aspect, the strength of the interface region of the insulator film that serves as a cracking start point can be improved, and the strength of the vibrating plate can be improved.

(2) In the liquid ejecting head according to the above-described aspect, a first ratio in the interface region may be smaller than the first ratio in the surface-layer region, where the ratio of the second intensity to the first intensity is denoted as the first ratio. According to the liquid ejecting head of the present aspect, the liquid ejecting head including a vibrating plate in which the first ratio in the interface region of the insulator film is smaller than the first ratio in the surface-layer region of the insulator film can be obtained.

(3) In the liquid ejecting head according to the above-described aspect, the first ratio in the interface region may be 0.4 or more and 0.7 or less. According to the liquid ejecting head of the present aspect, the liquid ejecting head including the vibrating plate in which the first ratio in the interface region of the insulator film is 0.4 or more and 0.7 or less can be obtained.

(4) In the liquid ejecting head according to the above-described aspect, the surface-layer region may include a region in which the first ratio is 0.3 or more and 0.7 or less. According to the liquid ejecting head of the present aspect, the liquid ejecting head including the vibrating plate in which the first ratio in the surface-layer region of the insulator film is 0.3 or more and 0.7 or less can be obtained.

(5) In the liquid ejecting head according to the above-described aspect, a second ratio in the interface region may be smaller than the second ratio in the surface-layer region, where a ratio of the third intensity to the first intensity is denoted as the second ratio. According to the liquid ejecting head of the present aspect, the liquid ejecting head including a vibrating plate in which the second ratio in the interface region of the insulator film is smaller than the second ratio in the surface-layer region of the insulator film can be obtained.

(6) In the liquid ejecting head according to the above-described aspect, the second ratio in the interface region may be 0.3 or more and 0.7 or less. According to the liquid ejecting head of the present aspect, the liquid ejecting head including the vibrating plate in which the second ratio in the interface region of the insulator film is 0.3 or more and 0.7 or less can be obtained.

(7) In the liquid ejecting head according to the above-described aspect, the surface-layer region may include a region in which the second ratio is 0.4 or more and 0.7 or less. According to the liquid ejecting head of the present aspect, the liquid ejecting head including the vibrating plate in which the second ratio in the surface-layer region of the insulator film is 0.4 or more and 0.7 or less can be obtained.

(8) In the liquid ejecting head according to the above-described aspect, the third intensity in the interface region may be lower than or equal to the second intensity. According to the liquid ejecting head of the present aspect, the liquid ejecting head including the vibrating plate in which the third intensity in the interface region is lower than or equal to the second intensity can be obtained.

(9) In the liquid ejecting head according to the above-described aspect, the $ZrO_2$ constituting the second layer may have a columnar crystal structure. According to the liquid ejecting head of the present aspect, the adhesiveness between the second layer and the first layer can be improved, and peeling and the like of the vibrating plate can be suppressed or prevented from occurring.

(10) In the liquid ejecting head according to the above-described aspect, the $ZrO_2$ constituting the second layer may have a monoclinic crystal structure. According to the liquid ejecting head of the present aspect, the adhesiveness between the second layer and the first layer can be improved, and peeling and the like of the vibrating plate can be suppressed or prevented from occurring.

(11) In the liquid ejecting head according to the above-described aspect, the interface region of the second layer may have compressive stress and the surface-layer region of the second layer may have tensile stress. According to the liquid ejecting head of the present aspect, the interface region can have the residual compressive stress, the surface-layer region can have the residual tensile stress, and the strength of the overall vibrating plate can be improved.

(12) According to another aspect of the present disclosure, a liquid ejecting apparatus is provided. The liquid ejecting apparatus includes the liquid ejecting head according to the above-described aspect and a control portion that controls an ejection operation of the liquid ejecting head. According to the liquid ejecting head of the present aspect, the liquid ejecting apparatus including the liquid ejecting head in which the strength of the vibrating plate is improved can be obtained.

The present disclosure may be realized in various forms other than the liquid ejecting head. The present disclosure may be realized in the forms of, for example, actuators, printing apparatuses, methods for controlling liquid ejecting apparatuses, methods for controlling liquid ejecting heads, methods for controlling actuators, liquid ejecting methods, computer programs for realizing these methods, and non-temporary recording mediums with the recorded computer programs.

What is claimed is:

1. A liquid ejecting head comprising:
a piezoelectric element; and
a vibrating plate configured to vibrate in response to actuation of the piezoelectric element, the vibrating plate including
a first layer that contains $SiO_2$ and
a second layer that contains $ZrO_2$ and that is stacked on the first layer, wherein
the second layer includes
an interface region in contact with the first layer and
a surface region opposite to the first layer,
where a degree of orientation of the (−211) crystal face of the second layer, measured by using an X-ray diffraction method, is denoted as a first intensity,
where the degree of orientation of the (−111) crystal face of the second layer, measured by using the X-ray diffraction method, is denoted as a second intensity, and
where the degree of orientation of the (002) crystal face of the second layer, measured by using the X-ray diffraction method, is denoted as a third intensity,
the interface region includes a region in which a first intensity is higher than a second intensity and in which the first intensity is higher than a third intensity, and
the surface region includes a region in which the first intensity is higher than the third intensity and in which the second intensity is higher than the third intensity.

2. The liquid ejecting head according to claim 1, wherein a first ratio in the interface region is smaller than the first ratio in the surface region, where a ratio of the second intensity to the first intensity is denoted as the first ratio.

3. The liquid ejecting head according to claim 2, wherein the first ratio in the interface region is 0.4 or more and 0.7 or less.

4. The liquid ejecting head according to claim 3, wherein the surface region includes a region in which the first ratio is 0.3 or more and 0.7 or less.

5. The liquid ejecting head according to claim 1, wherein a second ratio in the interface region is smaller than the second ratio in the surface region, where a ratio of the third intensity to the first intensity is denoted as the second ratio.

6. The liquid ejecting head according to claim 5, wherein the second ratio in the interface region is 0.3 or more and 0.7 or less.

7. The liquid ejecting head according to claim 6, wherein the surface region includes a region in which the second ratio is 0.4 or more and 0.7 or less.

8. The liquid ejecting head according to claim 1, wherein the third intensity in the interface region is lower than or equal to the second intensity.

9. The liquid ejecting head according to claim 1, wherein the $ZrO_2$ constituting the second layer has a columnar crystal structure.

10. The liquid ejecting head according to claim 1, wherein the $ZrO_2$ constituting the second layer has a monoclinic crystal structure.

11. The liquid ejecting head according to claim 1, wherein
the interface region of the second layer has compressive stress and
the surface region of the second layer has tensile stress.

12. A liquid ejecting apparatus comprising:
the liquid ejecting head according to claim 1; and
a control portion that controls an ejection operation of the liquid ejecting head.

13. An actuator comprising:
a piezoelectric element; and
a vibrating plate configured to vibrate in response to actuation of the piezoelectric element, the vibrating plate including
a first layer that contains $SiO_2$ and
a second layer that contains $ZrO_2$ and that is stacked on the first layer, wherein
the second layer includes
an interface region in contact with the first layer and
a surface region opposite to the first layer,
where a degree of orientation of the (−211) crystal face of the second layer, measured by using an X-ray diffraction method, is denoted as a first intensity,
where the degree of orientation of the (−111) crystal face of the second layer, measured by using the X-ray diffraction method, is denoted as second intensity, and
where the degree of orientation of the (002) crystal face of the second layer, measured by using the X-ray diffraction method, is denoted as a third intensity, and
the interface region includes a region in which a first intensity is higher than a second intensity and in which the first intensity is higher than a third intensity, and
the surface region includes a region in which the first intensity is higher than the third intensity and in which the second intensity is higher than the third intensity.

* * * * *